United States Patent
Kim et al.

(10) Patent No.: US 9,940,046 B2
(45) Date of Patent: Apr. 10, 2018

(54) SEMICONDUCTOR MEMORY DEVICE WITH OPERATION ENVIRONMENT INFORMATION STORING CIRCUIT AND COMMAND STORING FUNCTION

(71) Applicant: SAMSUNG ELECTRONICS CO., LTD., Suwon-si, Gyeonggi-Do (KR)

(72) Inventors: Chankyung Kim, Hwaseong-si (KR); Mijo Kim, Suwon-si (KR); Yonggyu Chu, Seoul (KR); Seungbum Ko, Hwaseong-si (KR); Soo Hwan Kim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/278,078

(22) Filed: Sep. 28, 2016

(65) Prior Publication Data
US 2017/0153831 A1  Jun. 1, 2017

(30) Foreign Application Priority Data

Nov. 27, 2015  (KR) .................. 10-2015-0167747
Feb. 18, 2016  (KR) .................. 10-2016-0019315

(51) Int. Cl.
| | |
|---|---|
| G06F 3/06 | (2006.01) |
| G11C 11/16 | (2006.01) |
| G11C 11/4093 | (2006.01) |
| G11C 29/52 | (2006.01) |
| G06F 11/07 | (2006.01) |

(52) U.S. Cl.
CPC .......... *G06F 3/0619* (2013.01); *G06F 3/0656* (2013.01); *G06F 3/0659* (2013.01); *G06F 3/0673* (2013.01); *G06F 3/0679* (2013.01); *G06F 11/079* (2013.01); *G06F 11/0727* (2013.01); *G06F 11/0751* (2013.01); *G06F 11/0793* (2013.01); *G11C 11/161* (2013.01); *G11C 11/1673* (2013.01); *G11C 11/1693* (2013.01); *G11C 11/4093* (2013.01); *G11C 29/52* (2013.01)

(58) Field of Classification Search
CPC ............. G06F 11/0751; G06F 11/0727; G06F 3/0673; G06F 11/0793; G06F 11/079; G06F 3/0656; G06F 3/0679; G06F 3/0619; G06F 3/0659; G11C 11/161; G11C 29/52; G11C 11/4093; G11C 11/1693; G11C 11/1673
USPC ................. 365/211, 158, 233.1, 194, 189.09
See application file for complete search history.

(56) References Cited

U.S. PATENT DOCUMENTS

| | | | |
|---|---|---|---|
| 4,293,932 | A | 10/1981 | McAdams |
| 5,784,328 | A | 7/1998 | Irrinki et al. |

(Continued)

*Primary Examiner* — David Lam
(74) *Attorney, Agent, or Firm* — Volentine & Whitt, PLLC

(57) ABSTRACT

A semiconductor memory device which stores operation environment information such as use time data, operating temperature data, or operating voltage data includes an internal circuit configured to perform a function set in the semiconductor memory device, and an operation environment information storing circuit configured to sense information about an operation environment of the semiconductor memory device when the semiconductor memory device operates, store the operation environment information in non-volatile memory cells, and provide the operation environment information stored in the non-volatile memory cells to an outside based on a request of reading out information.

12 Claims, 15 Drawing Sheets

(56) References Cited

U.S. PATENT DOCUMENTS

| | | | |
|---|---|---|---|
| 5,956,289 | A | 9/1999 | Norman et al. |
| 6,429,732 | B1 | 8/2002 | Tedrow et al. |
| 6,775,196 | B2 | 8/2004 | Perner et al. |
| 7,081,780 | B2 | 7/2006 | Briggs et al. |
| 7,272,063 | B1 | 9/2007 | Egerer et al. |
| 7,739,461 | B2 | 6/2010 | Hur et al. |
| 7,859,931 | B2 | 12/2010 | Hong et al. |
| 8,151,064 | B2 | 4/2012 | Lee |
| 8,220,992 | B2 | 7/2012 | Hong |
| 8,370,587 | B2 | 2/2013 | Miyamoto |
| 8,966,327 | B1 | 2/2015 | Wang |
| 9,207,949 | B2 * | 12/2015 | Lee .................. G06F 9/4401 |
| 2005/0141311 | A1 | 6/2005 | Kim et al. |
| 2013/0117641 | A1 | 5/2013 | Bains et al. |
| 2014/0013168 | A1 | 1/2014 | Bains et al. |
| 2014/0372792 | A1 | 12/2014 | Slaughter et al. |
| 2015/0046670 | A1 | 2/2015 | Kim et al. |
| 2015/0089111 | A1 | 3/2015 | Bains et al. |
| 2015/0204941 | A1 * | 7/2015 | Schneider .......... G01R 31/2855 |
| | | | 702/117 |

\* cited by examiner

SEMICONDUCTOR MEMORY DEVICE WITH OPERATION ENVIRONMENT INFORMATION STORING CIRCUIT AND COMMAND STORING FUNCTION

CROSS-REFERENCE TO RELATED APPLICATIONS

A claim of priority under 35 U.S.C. § 119 is made to Korean Patent Application No. 10-2015-0167747 filed Nov. 27, 2015 and Korean Patent Application No. 10-2016-0019315 filed Feb. 18, 2016, in the Korean Intellectual Property Office, the entire contents of which are hereby incorporated by reference.

BACKGROUND

The present inventive concept described herein relates to a semiconductor memory device, and more particularly, to a semiconductor memory device having a command storing function, which is capable of storing operation environment information when the semiconductor memory device is powered on.

In recent years, electronic appliances have been designed as necessarily including semiconductor devices such as processors and memories, and other semiconductor devices. In data processing systems for example, processors utilize main memory such as dynamic random-access memory (DRAM) or magneto resistive random-access memory (MRAM) as working memory. DRAMs or MRAMs may be mounted on a module substrate to constitute a memory module. A memory controller may typically control the memory module based on a request of a processor.

DRAM is volatile memory and may include a plurality of memory cells, each of which includes one access transistor and one storage capacitor. In contrast, spin transfer torque magneto resistive random access memory (STT-MRAM) is nonvolatile memory and has memory cells each including a magnetic tunnel junction (MTJ) device and a selection transistor. Data stored in the memory cells of STT-MRAM are not lost even when a power error occurs or power is shut off.

The MTJ device may include a fixed layer, a free layer and a tunnel layer interposed between the fixed and free layers. A magnetization direction of the fixed layer is fixed, and a magnetization direction of the free layer is the same or opposite the magnetization direction of the fixed layer based on conditions.

When an arbitrary one among memory cells does not maintain its stored data over time, the memory cell becomes a defective memory cell which may cause a read error. As memory cells become defective, internal circuits configured to perform functions according to data stored in DRAMs or MRAMs including the defective memory cells may in turn malfunction and/or become defective over time.

SUMMARY

Embodiments of the inventive concept provide a semiconductor memory device which includes an internal circuit configured to perform a function set in the semiconductor memory device; and an operation environment information storing circuit configured to sense information about operation environment of the semiconductor memory device when the semiconductor memory device operates, store the operation environment information in non-volatile memory cells, and provide the operation environment information stored in the non-volatile memory cells externally of the semiconductor memory device in response to a request for reading out information.

Embodiments of the inventive concept provide a memory system which includes a semiconductor memory device including an operation environment information storing circuit configured to sense operation environment information of a device during a power-on operation and to store the operation environment information in non-volatile memory in units of time periods, and a memory controller configured to receive the operation environment information provided from the semiconductor memory device by accessing the operation environment information storing circuit of the semiconductor memory device.

Embodiments of the inventive concept provide a semiconductor memory device which includes an internal circuit configured to perform a function set in the semiconductor memory device, the semiconductor memory device comprising volatile memory cells; a command latch circuit configured to latch commands received externally of the semiconductor memory device and control an operation of the internal circuit; and a command history storing circuit configured to store the latched commands from the command latch circuit and output the stored command externally from the semiconductor memory device in response to a received request signal, the command history storing circuit configured to store a set capacity of the latched commands.

Embodiments of the inventive concept provide semiconductor memory device including a DRAM memory circuit which includes a DRAM memory cell array; a control logic configured to buffer or decode a command received from outside to control a memory operation of the DRAM memory circuit; a command error detector configured to compare the received command with a provided valid format command to detect whether an error occurs in the received command; a command error correcting circuit configured to correct an error when the error occurs in the received command and is a correctable error; and an invalid command storing circuit configured to store the received command by a set capacity when the error is uncorrectable and to output the stored command to the outside in response to an output request signal.

Embodiments of the inventive concept provide a semiconductor memory device including an internal circuit configured to perform a function set in the semiconductor memory device; a command latch configured to latch commands received externally of the semiconductor memory device and control operations of the internal circuit responsive to the latched commands; an operation environment information storing circuit configured to sense information about an operation environment of the semiconductor memory device when the semiconductor memory device operates, and store the operation environment information in non-volatile memory cells; and a command history storing circuit configured to store the latched commands from the command latch circuit, and to output the stored commands and the operation environment information stored in the non-volatile memory cells externally of the semiconductor memory device in response to a request for reading information.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Exemplary embodiments cif the inventive concept will be described more fully hereinafter with reference to the accompanying drawings. It should be understood that general data access operations and general fuse program operations of DRAM and MRAM and details of some internal functional circuits may be omitted so as not to obscure the inventive concept.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
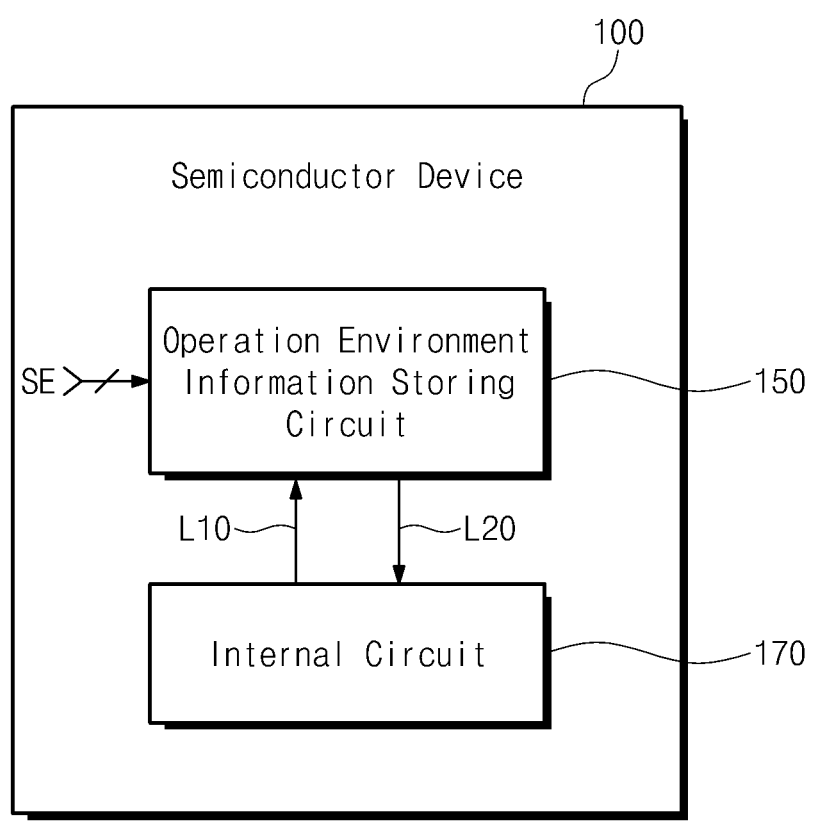
FIG. 1 illustrates a block diagram of a semiconductor device according to an embodiment of the inventive concept.

FIG. 1 illustrates a block diagram of a semiconductor device according to an embodiment of the inventive concept. Referring to FIG. 1, the semiconductor device 100 includes an operation environment information storing circuit 150 and an internal circuit 170.

The internal circuit 170 performs a function set in the semiconductor device 100. For example, in embodiments where the semiconductor device 100 is a semiconductor memory device such as an MRAM, the internal circuit 170 may for example include a DC voltage generator for generating a DC voltage such as an internal power voltage or a high voltage, an output driver for driving output data, a sense amplifier for sensing data, an input buffer for inputting data, an output buffer for outputting data, a termination circuit for performing an on-die termination function, or other elements/circuits.

The operation environment information storing circuit 150 senses information about operation environment of the semiconductor memory device when the semiconductor memory device operates, and stores the operation environment information in non-volatile memory cells in units of predetermined periods. The stored operation environment information is provided to an outside external of the semiconductor device 100 when a request of reading out information occurs. A memory controller or host may predict an exchange time for replacing the semiconductor device 100 by using the operation environment information.

The operation environment information storing circuit 150 may operate in response to an operation enable signal SE. The operation enable signal SE may be internally generated or provided from outside the semiconductor device 100. Thus, a field error prediction of the semiconductor device may be performed by using the operation environment information.

Meanwhile, the stored operation environment information may be used to adjust an operation parameter of the internal circuit 170. The operation environment information circuit 150 may receive an operation parameter of the internal circuit 170 through a line L10. When a difference between the operation parameter and a reference parameter is greater than a set value, the operation environment information circuit 150 may update the operation parameter based on the operation environment information. An adjustment control signal for changing the current operation parameter into the updated operation parameter may be applied to the internal circuit 170 through a line L20. Thus, the internal circuit 170 of the semiconductor device 100 may be tuned by using the operation environment information.

Figure 2:
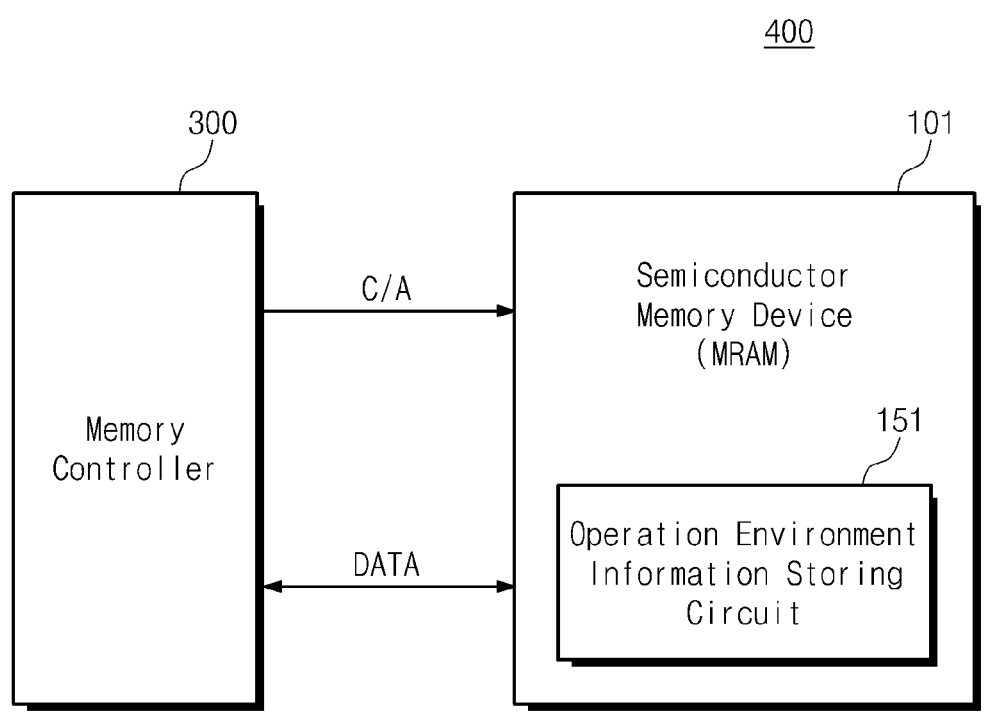
FIG. 2 illustrates a block diagram of a memory system according to an embodiment of the inventive concept.

FIG. 2 illustrates a block diagram of a memory system according to an embodiment of the inventive concept. Referring to FIG. 2, the memory system 400 includes a semiconductor memory device 101 and a memory controller 300. The memory controller 300 may receive an instruction from a host such as a processor. The memory controller 300 may provide a command and an address C/A to the semiconductor memory device 101. The memory controller 300 may provide data DATA to the semiconductor memory device 101 for storage therein. The data DATA read from the semiconductor memory device 101 may be provided to the memory controller 300.

The semiconductor memory device 101 includes an operation environment information storing circuit 151.

When the semiconductor memory device 101 operates, the operation environment information storing circuit 151 senses information about the operation environment of the semiconductor memory device 101, and persistently and permanently stores the sensed operation environment information in non-volatile memory cells in units of predetermined periods. The stored operation environment information may be provided to the memory controller 300 when a request for reading out information occurs from the memory controller 300. Thus, the memory controller 300 may predict an exchange time or durability of the semiconductor memory device 101 by using the operation environment information. Therefore, a field error prediction of the semiconductor memory device 101 may be performed by using the operation environment information.

Meanwhile, as shown in FIG. 1, the stored operation environment information may be used to adjust a parameter of an internal circuit 170 and may be provided to the internal circuit 170.

The embodiment shown in FIG. 2 is not limited to the semiconductor memory device 101, and the semiconductor memory device 101 may be an STT-MRAM. A volatile memory device such as an SRAM or a DRAM loses its stored data when power is removed. In contrast, a non-volatile memory device such as an MRAM (Magneto Resistive Random Access Memory) maintains its stored data even after power has been removed. Thus, in case that it is desired to maintain data even when a power error occurs or power is removed, non-volatile memory devices may be preferably used to store data. Therefore, when semiconductor memory devices are implemented with STT-MRAM, the merits of MRAM may be added to the merits of DRAM.

An STT-MRAM cell may include a selection transistor having a gate connected to a word line and an MTJ (Magnetic Tunnel Junction) device for storing mutually different data according to a magnetizing direction. The MTJ device may include at least one fixed layer, at least one free layer, and at least one tunnel layer formed between the fixed layer and the free layer. The magnetizing direction of the fixed layer may be generally fixed and the magnetizing direction of the free layer may be the same or opposite the fixed layer according to a bias condition. For example, when the magnetizing direction of the free layer is the same as the fixed layer the stored data is "1", and when the magnetizing direction of the free layer is opposite to that of the fixed layer the stored data is "0".

Although the semiconductor 101 is described as STT MRAM, as mentioned above in other embodiments semiconductor memory device 101 may for example be implemented by using Electrically Erasable Programmable Read-Only Memory (EEPROM), a flash memory, Magnetic RAM (MRAM), conductive bridging RAM (CBRAM), Ferroelectric RAM (FeRAM), Phase change RAM (PRAM) called Ovonic Unified Memory (OUM), Resistive RAM (RRAM or ReRAM), nanotube RRAM, Polymer RAM (PoRAM), Nano Floating Gate Memory (NFGM), a holographic memory, a molecular electronics memory device, an insulator resistance change memory or the like.

In addition, the semiconductor memory device 101 may include double data rate synchronous (DDR) such as DDR3 or DDR4 DRAM, except for as a storing circuit in the operation environment information storing circuit 151.

In addition, the semiconductor memory device 101 may include a random access memory device in which STT MRAM cells and DRAM cells are mixed with each other.

The semiconductor memory device 101 may be applied to a portable terminal such as a smart phone as low-power mobile RAM.

Figure 3:
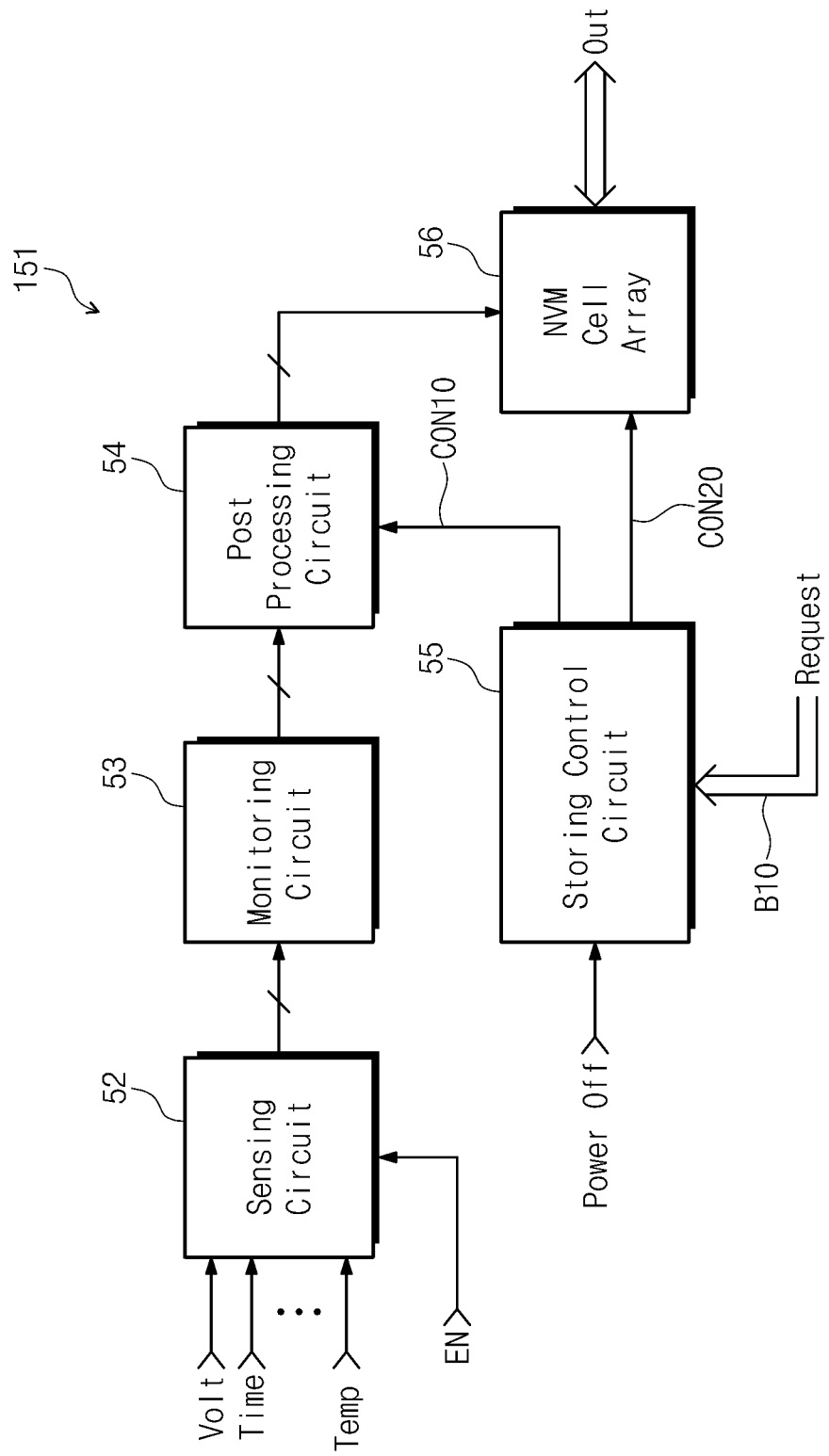
FIG. 3 illustrates a block diagram of an operation environment information storing circuit according to an embodiment of the inventive concept.

FIG. 3 illustrates a block diagram of an operation environment information storing circuit according to an embodiment of the inventive concept.

The operation environment information storing circuit 151 includes a sensing circuit 52, a monitoring circuit 53, a post processing circuit 54, a storing control circuit 55, and an NVM cell array 56.

The sensing circuit 52 performs a sensing operation in response to an enable signal EN. The sensing circuit 52 may convert various kinds of analog signals provided as sensing inputs into digital data. For example, when the operating voltage of the semiconductor memory device 101 powered on is 1.2 V, the analog voltage 1.2 V (sensing signal VOLT) may be converted into 4-bit digital data. In addition, when the operating temperature of the semiconductor memory device 101 powered on is 35° C., the 35° C. as represented in analog (sensing signal Temp) may be converted into 8-bit digital data. In addition, time data may be cumulatively totaled by continuously counting a reference clock signal while the semiconductor memory device 101 is powered on or in a power-on state.

The monitoring circuit 53 may monitor the sensed operation environment information such as use time data, operating temperature data, or operating voltage data as provided from sensing circuit 52. The monitoring circuit 53 may monitor whether the use time data, the operating temperature data, or the operating voltage data is out of an expected or desired range of corresponding reference data or not.

In this case, the use time data may represent a total cumulative time that the semiconductor memory device 101 is powered on. For example, if it is assumed that the durability of MRAM cells is 8 years, by the time that 8 years are elapsed, an alarm signal informing that the memory chip should be exchanged (replaced) is provided from the system.

The operating temperature may represent ambient temperature when the semiconductor memory device 101 is operated. The ambient temperature may be stored as the maximum and minimum values thereof. For example, when the maximum daily temperature values and the maximum monthly temperature values are stored, the use history based on temperature may be understood.

The operating voltage data may represent an operating voltage of the semiconductor memory device 101. The normal, maximum and minimum voltage values may be stored as the operating voltages. For example, when a read error occurs in the semiconductor device 101, the reason for the read error may be understood by checking the operating voltages.

The post processing circuit 54 processes the monitoring result of the monitoring circuit 53. The post processing circuit 54 post-processes the information output from the sensing circuit 52 such that the operation environment information is stored in the non-volatile memory (NVM) cells of NVM cell array 56 according to data type. Thus, the operation environment information may be stored in set storage areas according to kinds thereof.

The post processing circuit 54 may be driven according to a control signal provided through a line CON10 from the control circuit 55.

The storing control circuit 55 performs a control operation such that the operation environment information is stored and output. Since the storing control circuit 55 safely operates only while the storing control circuit 55 is powered on, the storing control circuit 55 may receive a power-off signal (Power Off). In this case, just before the storing control circuit 55 is effectively powered off, the power-off signal is provided as a low voltage. Thus, when the power-off signal of low voltage is detected indicative that storing control circuit 55 is to be powered off, the storing control circuit 55 may provide control such that the operation environment information is stored in the non-volatile memory cells of NVM cell array 56.

The storing control circuit 55 may generate an update signal as a command to allow the operation environment information to be updated. The update signal may be provided through line CON10 to post processing circuit 54 which may be configured to update the operation environment information in NVM cell array 56 using the output from monitoring circuit 53. For example, in case of DRAM, the update signal may be generated by storing control circuit 55 by counting a refresh command signal during a refreshing operation. In embodiments of the inventive concept, when the period tREF of a refresh counting clock signal is 1 ms, the counting is performed 64 times during a refresh section REFD. The update signal may be generated by counting refresh command signals to a set number.

Meanwhile, in case of MRAM, the update signal may be periodically generated by using an oscillating clock.

The NVM cell array 56 may include NVM memory cells for permanently storing the operation environment information. The NVM memory cells may be arranged in a matrix of rows and columns. The rows may correspond to word lines of the operation environment information storing memory and the columns may correspond to bit lines of the operation environment information storing memory. The NVM cell array 56 may include STT MRAM memory cells for example.

When a read request (Request) is applied from an outside to the storing control circuit 55 through line B10, the storing control circuit 55 may apply a read command to the NVM cell array 56 through a line CON20. Thus, the operation environment information stored in a set area in the NVM cell array 56 is output through an output terminal Out.

Although the operation environment information is described with respect to FIG. 3 as being stored in the non-volatile memory cells within NVM cell array 56, in other embodiments the operation environment information may for example be stored using anti-fuses.

An anti-fuse, which generally is a resistive fuse device, has high resistance (for example, 100 MΩ) in a non-programmed state, and has low resistance (for example, 100 KΩ or less) after being programmed. For example, an anti-fuse may include a very thin dielectric material of several to several hundreds Å, such as a complex material in which a dielectric material such as $SiO_2$, silicon nitride, tantalum oxide or silicon dioxide-silicon nitride-silicon dioxide (ONO) is interposed between two conductive materials.

An anti-fuse may be programmed (or stored) with the information through a scheme of destroying the dielectric material between both conductive materials by applying a high voltage (such as 10 V) through anti-fuse terminals for a sufficient time. Thus, when the anti-fuse is programmed, the conductive materials of both ends of the anti-fuse are short circuited with each other, so that the anti-fuse has a resistance value less than that before being programmed. Therefore, before being programmed, the anti-fuse is generally in an electrically open-circuited state. After being programmed, the anti-fuse is in an electrically short-circuited state. Corresponding anti-fuses may be programmed to store or update the operation environment information.

Similarly to the principle of the reading operation of memory cell array 56, the operation environment information stored in the programmed anti-fuse array may be read out to an outside by the storing control circuit 55 responsive to the read request (Request).

In other embodiments, the operation environment information may for example be stored in a non-volatile storage medium including e-fuses or a PRAM memory cells.

The operation environment information may be used to generate an adjustment control signal for adjusting an operating parameter of the internal circuit of the semiconductor memory device 101.

In embodiments of the inventive concept, when the adjustment control signal is applied to the internal circuit of the semiconductor memory device 101, the output level of a DC voltage used as an internal power voltage or a high voltage of the internal circuit may be changed. In other embodiments, the adjustment control signal may for example be applied to the internal circuit to change the delay times of internal signals, to change the drivability of drivers, to change the buffering ability of buffers and/or to change the sensing ability of a sensing amplifier.

Figure 4:
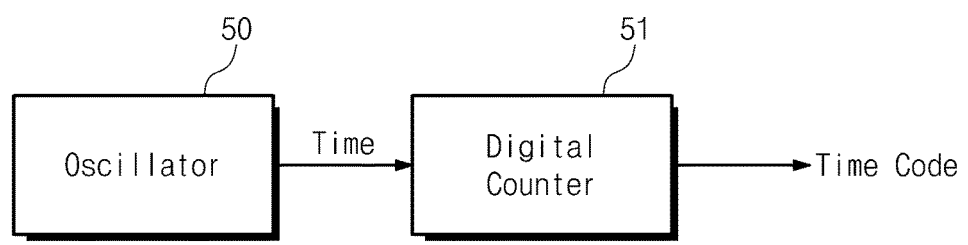
FIG. 4 illustrates a block diagram of a time code generating unit configured to generate use time data in connection with the sensing circuit of FIG. 3.

FIG. 4 illustrates a block diagram of a time code generating unit configured to generate use time data in connection with the sensing circuit of FIG. 3. Referring to FIG. 4, the time code generating unit includes an oscillator 50 and a digital counter 51.

The oscillator 50 may be implemented by using a ring oscillator to generate an oscillating clock Time having a predetermined frequency. In this case, since the frequency of the oscillating clock is for the purpose of obtaining time in units of seconds, the frequency of the oscillating clock may be lower than that of an oscillating clock used for a reading or writing operation of the semiconductor memory device.

The digital counter 51 counts the oscillating clock. As the counting result, time codes representing years, months, days, hours, minutes, and seconds may be obtained. The time code is basic information for obtaining use time data of the operation environment information. The time code generating unit of FIG. 4 may be configured separately from that of FIG. 3, or may be included in the sensing circuit 52 and/or the monitor circuit 53.

Figure 5:
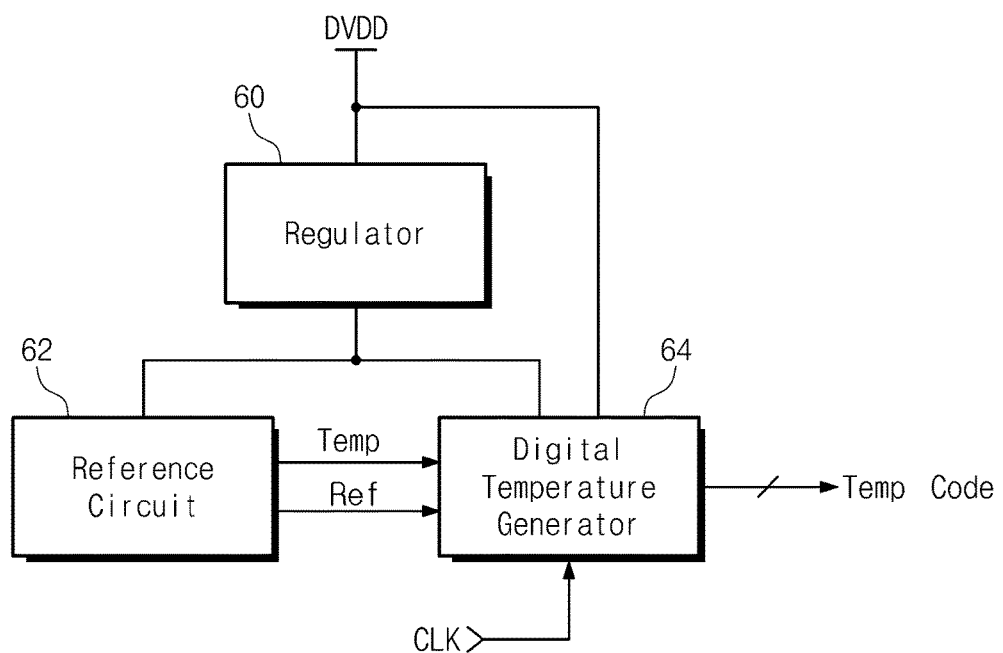
FIG. 5 illustrates a block diagram of a temperature code generating unit configured to generate use temperature data in connection with the sensing circuit of FIG. 3.

FIG. 5 illustrates a block diagram of a temperature code generating unit configured to generate use temperature data in connection with the sensing circuit of FIG. 3. Referring to FIG. 5, the temperature code generating unit includes a regulator 60, a reference circuit 62 and a digital temperature generator 64.

The regulator 60 receives a supply voltage DVDD and generates a regulating voltage VDDR having a constant level.

The reference circuit 62 uses the regulating voltage VDDR to generate a temperature information signal Temp which is changed according to a temperature. In addition, the reference circuit 62 may generate a reference signal Ref having a constant voltage level without regard to temperature change.

The digital temperature generator 64 generates a digital temperature code Temp Code indicative of the sensed temperature by using the temperature information signal Temp and the reference signal Ref. The temperature information signal Temp and the reference signal Ref may be analog signals, that is, an analog voltage signal and an analog current signal, respectively. The digital temperature generator 64 converts the temperature information signal Temp and the reference signal Ref into digital signals. The digital temperature generator 64 may generates the converted digital signal to generate a digital temperature code Temp Code by comparing Temp and Ref signals. Although the temperature code generating unit as shown in FIG. 5 includes the regulator 60, in other the regulator 60 may be omitted.

Meanwhile, in other embodiments the temperature code generating unit of FIG. 5 may further include an additional power circuit such as a charge pump circuit, a DC-DC converter, or LDO (Low Drop Out Regulator). The additional power circuit may generate a voltage to be input to the sensing circuit 52 based on the supply voltage DVDD. Thus, the temperature code generating unit may directly use the supply voltage DVDD provided from the memory controller 300 and provided through an additional power circuit.

The digital temperature code Temp Code is basic information used for obtaining operation temperature data from the operation environment information.

Figure 6:
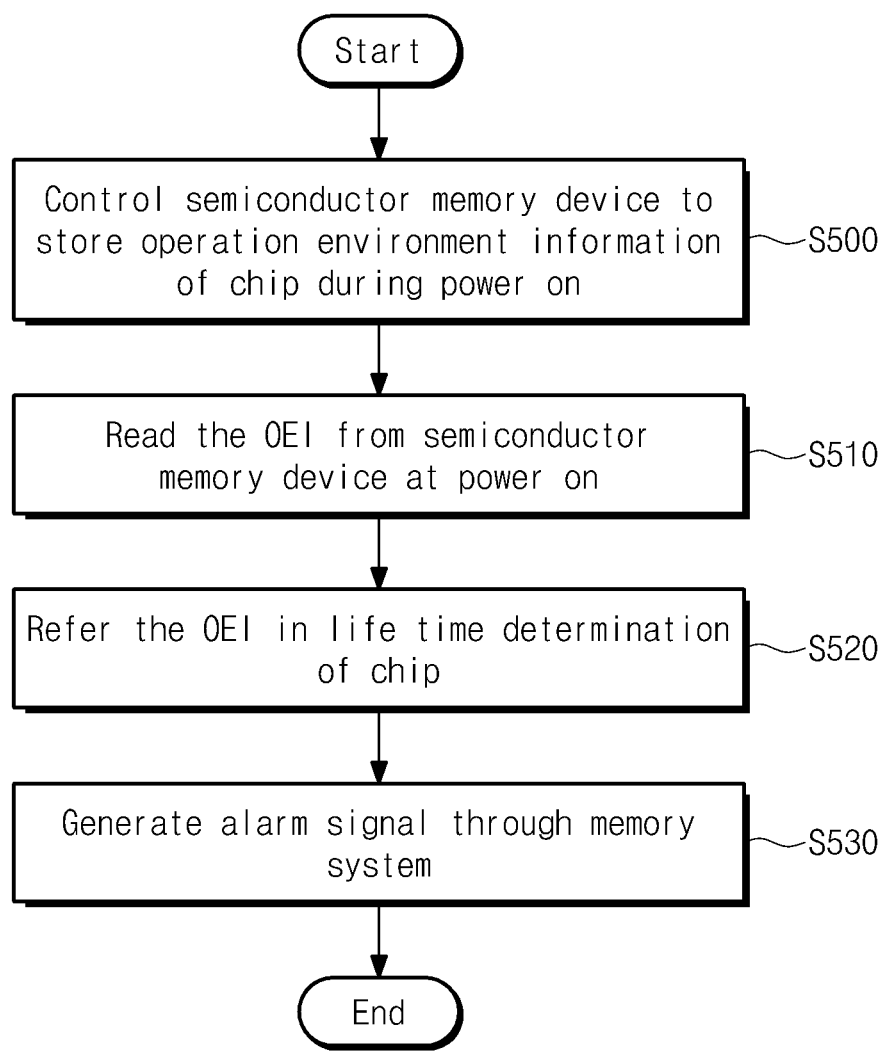
FIG. 6 illustrates a flowchart of an operation environment information storing and reading control according to an embodiment of the inventive concept.

FIG. 6 illustrates a flowchart of an operation environment information storing and reading control according to an embodiment of the inventive concept.

Referring to FIGS. 2 and 6, in step S500, the memory controller 300 controls the semiconductor memory device 101 to store the operation environment information of a chip within the internal circuit when the semiconductor memory device 101 is powered on. Thus, for example, the operation environment information OEI of the chip is permanently stored in the NVM cell array 56.

In step S510, the memory controller 300 reads out the operation environment information from the semiconductor memory device 101 when the semiconductor memory device 101 is powered on. Thus, the operation environment information such as use time data, operation temperature data, and operating voltage data is output.

In step S520, the memory controller 300 may refer to the operation environment information when the chip durability is determined, to predict the exchange time of the semiconductor memory device 101. When it is assumed that the semiconductor memory device 101 has been used for months or years and the temperature reaches an upper limit level, the memory controller 300 may predict the exchange time based thereon.

In step S530, the memory controller 300 may generate an alarm signal through a memory system at the predicted exchange time. Thus, the alarm signal may be transmitted to a host existing outside the memory system 400 shown in FIG. 2 or may be used to drive an alarm proving warning to an outside. Meanwhile, the operation environment information may be utilized for the measurement analysis of the semiconductor memory device 101.

Figure 7:
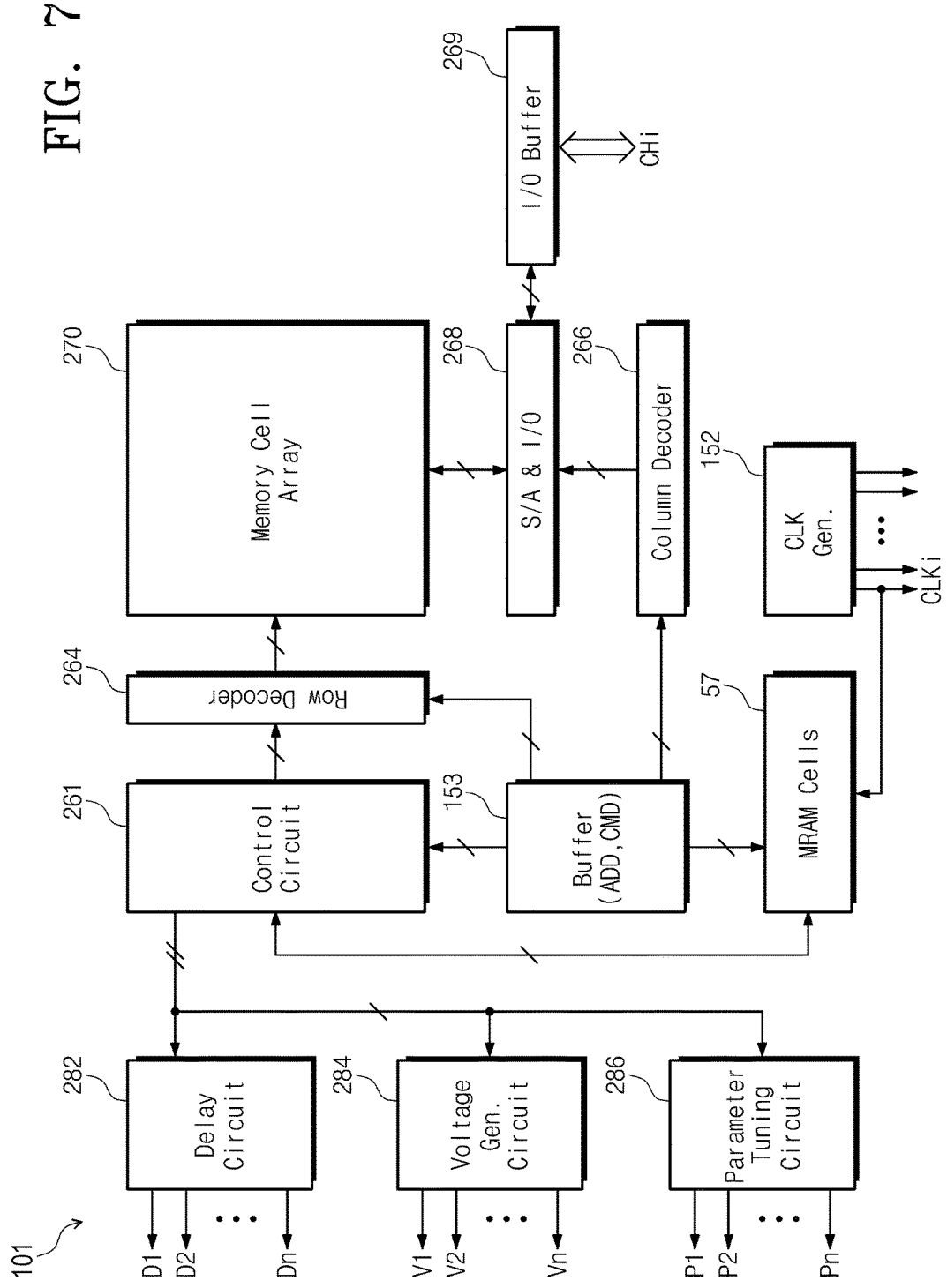
FIG. 7 illustrates a block diagram of the semiconductor memory device of FIG. 2.

FIG. 7 illustrates a block diagram of the semiconductor memory device of FIG. 2. Referring to FIG. 7, the semiconductor memory device 101 includes a control circuit 261, a row decoder 264, a column decoder 266, a memory cell array 270, a sense amplifier and input/output circuit 268, an input/output (I/O) buffer 269, a buffer 153, MRAM cells 57, a clock generator 152, a delay circuit 282, a voltage generating circuit 284, and a parameter tuning circuit 286. The internal circuit in the semiconductor memory device 101 in FIG. 7 may be characterized as including at least the row decoder 264, the column decoder 266, the memory cell array 270, the sense amplifier and input/output circuit 268, the input/output (I/O) buffer 269, the delay circuit 282, the voltage generating circuit 284, and the parameter tuning circuit 286.

The clock generator 152 may generate clock signals. An arbitrary output clock signal CLKi among the clock signals may be the same oscillating clock Time as output the oscillator 50 of FIG. 4.

The MRAM cells 57 may be operated as a storage medium for storing the operation environment information.

The control circuit 261 may output the operation environment information to an outside external of semiconductor memory device 101, or may generate the adjustment control signal responsive to the operation environment information for internal use of the semiconductor memory device 101. The operation environment information storing circuit in semiconductor memory device 101 of FIG. 7 may be characterized as at least including control circuit 261.

The adjustment control signal may for example be provided to at least one of the delay circuit 282, the voltage generating circuit 284 and the parameter tuning circuit 286.

For example, in FIG. 7, when the adjustment control signal is applied to the delay circuit 282, the delay circuit 282 may change delay degree of the output delay signals D1-Dn which are applied to internal circuits of the semiconductor memory device 101 to change delay times of the internal circuit. As the use time of the semiconductor memory device is increased, the delay degree may be changed differently from that initially set. When the delay degree changed according to the use time of the semiconductor memory device is adjusted to be matched with a statistical value, the delay degree of the semiconductor memory device may be restored similarly to the initial set state.

The memory cell array 270 may include MRAM cells or DRAM cells. The memory cell array 270 may be divided into a plurality of banks.

The control circuit 261 may receive a control signal and an address applied for data access and may generate internal control signals (all of which may not be particularly shown in FIG. 7) for controlling set operation modes in the internal circuit of the semiconductor memory device 101.

The buffer 153 receives the applied address from memory controller 300 and performs the buffering. The buffer 153 may provide a row address for selecting a row of the memory cell array 270 to the row decoder 264 and may provide a column address for selecting a column of the memory cell array 270 to the column decoder 266.

The buffer 153 receives a command applied thereto from memory controller 300 and buffers the command. The command is applied to the control circuit 261 and is decoded.

In response to an internal control signal, the row decoder 264 decodes the row address. When the result of decoding the row address is applied to the memory cell array 270, the word line selected from a plurality of word lines connected to the memory cells is enabled.

In response to an internal control signal, the column decoder 266 decodes the column address. Column gating is performed according to the decoded column address. Responsive to the column gating result, one bit line is selected from the bit lines connected to the memory cells of memory cell array 270.

The sense amplifier and input/output circuit 268 detects a voltage of the bit line of the selected memory cell to sense the data stored in the selected memory cell.

The I/O buffer 269 buffers input/output data. In a reading operation mode, the I/O buffer 269 buffers the data read out from the sense amplifier and input/output circuit 268 outputs the buffered data to a channel CHi.

As described with reference to FIG. 7, the operation environment information may be utilized to tune the internal circuit of the semiconductor memory device using any of delay circuit 282, voltage generating circuit 284, and parameter tuning circuit 286.

In addition, when the operation environment information is read out to an outside, the durability and a field error of the semiconductor memory device may be predicted.

Figure 8:
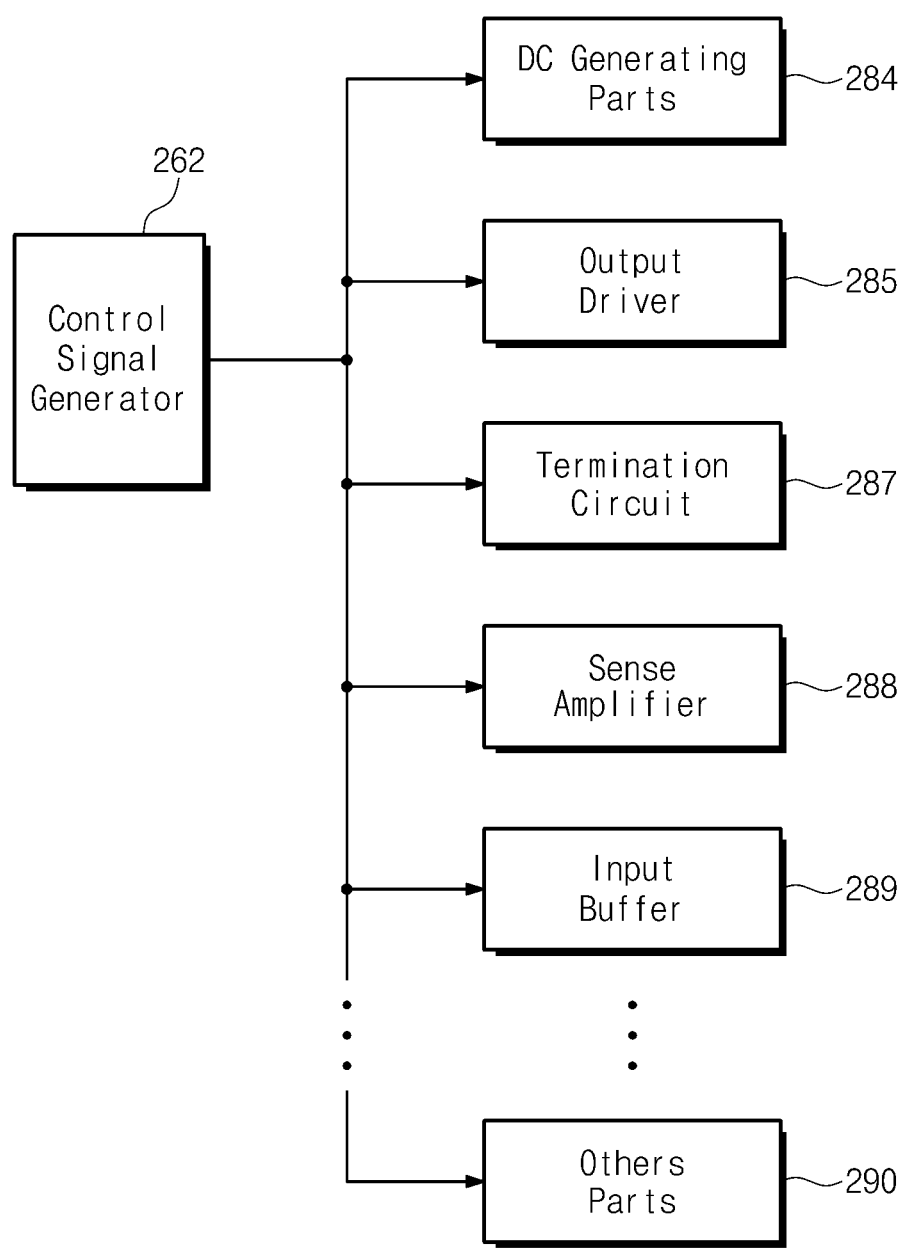
FIG. 8 illustrates a block diagram including further parts of the internal circuit of FIG. 7.

FIG. 8 illustrates a block diagram including further parts of the internal circuit in the semiconductor memory device 101 of FIG. 7. Referring to FIG. 8, one example of a control signal generator 262 in the control circuit 261 of FIG. 7 is shown, which is connected to various kinds of functional blocks 284 to 290 corresponding to the internal circuit. Thus, FIG. 8 shows a system of transferring the adjustment control signal of the control circuit 261 to the internal circuit of the semiconductor memory device 101 of FIG. 7.

For example, the adjustment control signal generated from the control signal generator 262 may be applied to at least one selected from DC generating parts 284, an output driver 285, a termination circuit 287, a sense amplifier 288, an input buffer 289, and other blocks (parts) 290.

The DC generating parts 284 may include an internal voltage generator for generating a reference or internal voltage, a high-voltage generator or a substrate voltage generator. When the adjustment control signal is applied to the substrate voltage generator of the DC generating parts 284, the level of a negative voltage (or substrate bias voltage) applied to the substrate or bulk of the semiconductor memory device 101 may for example be adjusted.

When the adjustment control signal is applied to the output driver 285, the drivability of the output driver of the semiconductor memory device 101 may for example be adjusted.

When the adjustment control signal is applied to the termination circuit 287, the on-die termination resistance value of the semiconductor memory device 101 may for example be adjusted.

When the adjustment control signal is applied to the sense amplifier 288, the sensing margin or sensing operation time of the sense amplifier of the semiconductor memory device 101 may for example be adjusted.

The input buffer 289 is configured to buffer data within the internal circuit. When the adjustment control signal is applied to the input buffer 289, the buffering ability of the input buffer of the semiconductor memory device 101 may for example be adjusted. For example, the buffering ability may comprise the ability of the input buffer to adjust timing.

Figure 9:
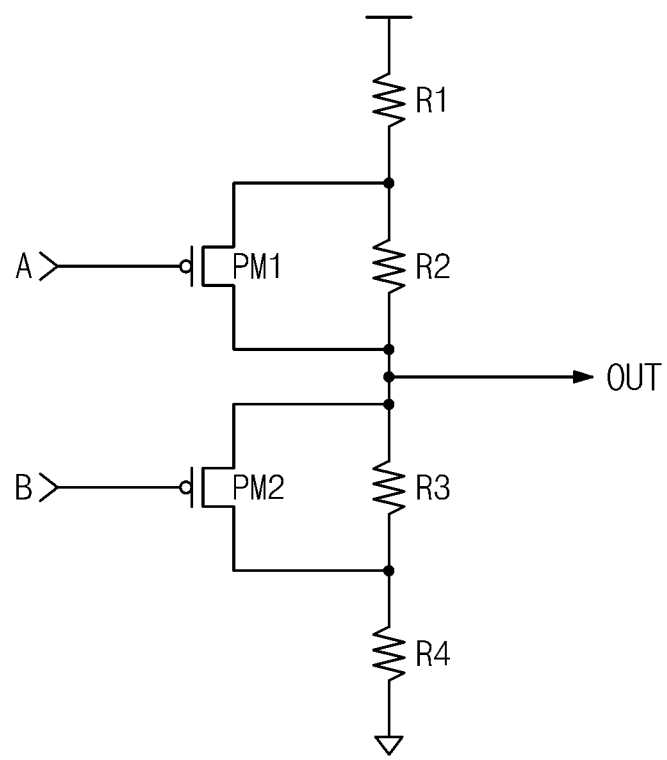
FIG. 9 illustrates a circuit diagram of a variable voltage controller that may be applied in FIG. 7.

FIG. 9 illustrates a circuit diagram of a variable voltage controller that may be applied to FIG. 7. Referring to FIG. 9, connections between PMOS transistors PM1 and PM2 and the first to fourth resistors R1 to R4 are shown. When the adjustment control signal is applied to the gate terminal of the PMOS transistor PM1 as a control signal A, the resistor R2 is selectively connected to the resistor R1 according to a turn on or off of the PMOS transistor PM1. For example, when the PMOS transistor PM1 is turned on, only the resistance value of the first resistor R1 exists between the power voltage and the output terminal OUT. When the PMOS transistor PM1 is turned off, the value of the serial combined resistance of the first and second resistors R1 and R2 exists between the power voltage and the output terminal OUT. The serial combined resistance value is greater than that of the first resistor R1.

When the adjustment control signal is applied to the gate terminal of the PMOS transistor PM2 as a control signal B, the resistor R3 is selectively connected to the resistor R4 according to a turn on or off of the PMOS transistor PM2. For example, when the PMOS transistor PM2 is turned on, only the resistance value of the fourth resistor R4 exists between the output terminal OUT and the ground. When the PMOS transistor PM2 is turned off, the value of the serial combined resistance of the third and fourth resistors R3 and R4 exists between the output terminal OUT and the ground. The serial combined resistance value is greater than that of the fourth resistor R4.

The output characteristics of the voltage generating circuit 284 of the internal circuit may be adjusted by configuring it to include the variable voltage controller as shown FIG. 9. In the circuit of FIG. 9, resistors may be further added to the circuit and control transistors may be further installed in parallel to the circuit. The level of the output voltage OUT may be more finely adjusted through the additional installations to provide various voltages V1, V2, . . . Vn from generating circuit 284 shown in FIG. 7.

Examples of changing the resistance value of the internal circuit according to the adjustment control signal will be described with reference to FIGS. 10 and 11.

Figure 10:
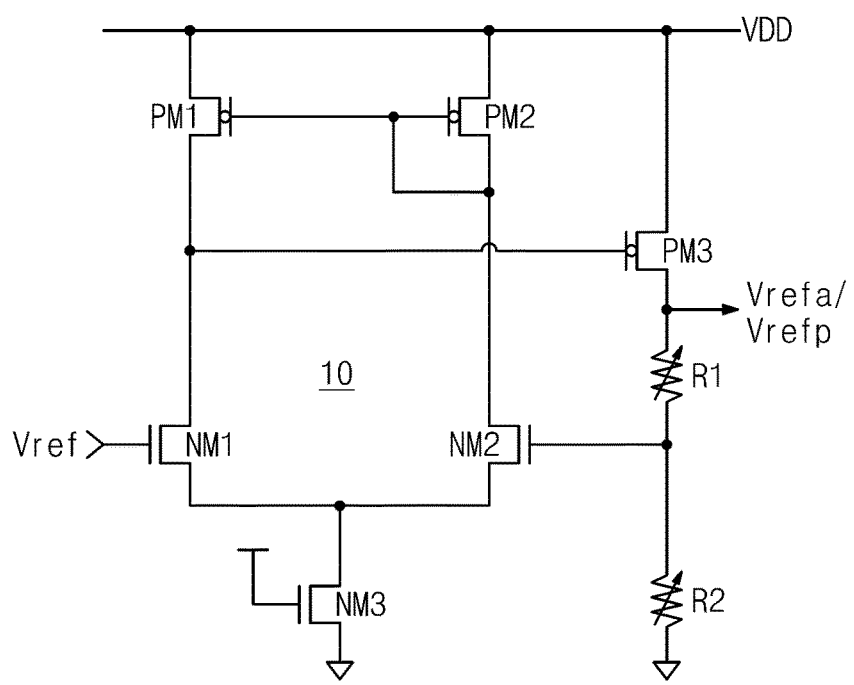
FIG. 10 illustrates a circuit diagram of the internal voltage generator of FIG. 8.

FIG. 10 illustrates a circuit diagram of the internal voltage generator of FIG. 8. That is, FIG. 10 shows a configuration of a reference voltage generator of the internal voltage generator in the DC generating parts 284.

The reference voltage generator of FIG. 10 may be classified into a generator for generating a cell array reference voltage Vrefa provided to the memory cell array of the semiconductor memory device 101 and a generator for generating a peripheral circuit reference voltage Vrefp provided to a peripheral circuit of the semiconductor memory device 101.

The reference voltage generator of FIG. 10 includes a current mirror type differential amplifier including PMOS transistors PM1 and PM2 and NMOS transistors NM1 to NM3, a driving PMOS transistor PM3 and first and second variable resistors R1 and R2. A general reference voltage generator may substantially have the same configuration as that of FIG. 10, except for the first and second variable resistors R1 and R2.

The adjustment control signal changes the resistance values of the first and second variable resistors R1 and R2 in the reference voltage generator, such that the reference voltage output characteristics may be adjusted. In detail, the level-up or upper limit of the reference voltage Vrefa or Vrefp may be adjusted by increasing the resistance value of the first variable resistor R1 or decreasing the resistance value of the second variable resistor R2. The level-down or lower limit of the reference voltage Vrefa or Vrefp may be adjusted by decreasing the resistance value of the first variable resistor R1 or increasing the resistance value of the second variable resistor R2.

When the resistance values of the first and second variable resistors R1 and R2 in the reference voltage generator are changed in the same operation principle as that shown in FIG. 9, the reference voltage output characteristics are adjusted. That is, as described through FIG. 9, the control transistors are controlled by the adjustment control signal such that the resistance value of the first or second variable resistor R1 or R2 may be adjusted.

Figure 11:
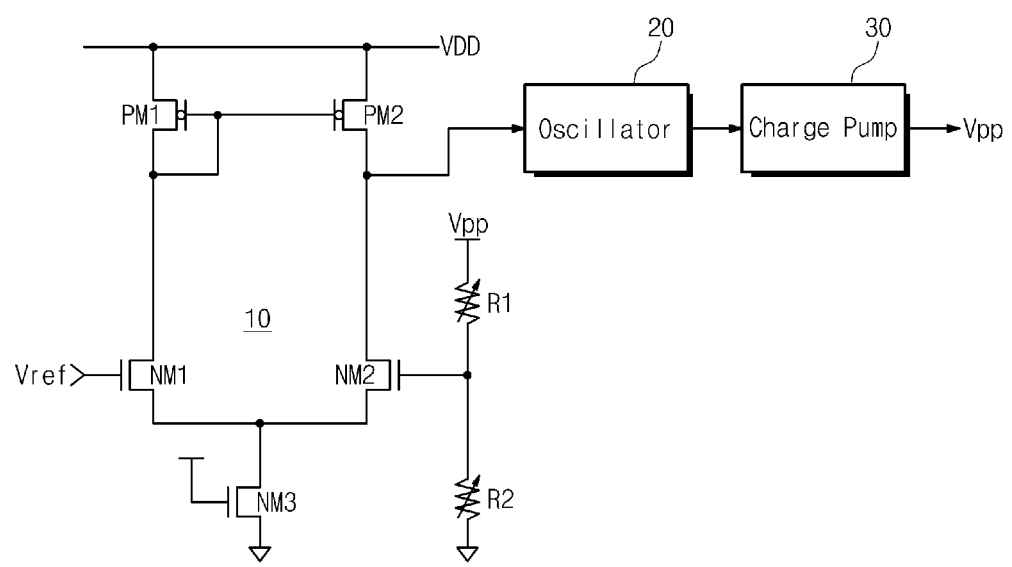
FIG. 11 illustrates a circuit diagram of the high-voltage generator of FIG. 8.

FIG. 11 illustrates a circuit diagram of the high-voltage generator of FIG. 8. That is, FIG. 11 shows a circuit of the high-voltage generator which generates a high voltage VPP required to enable the word lines of the memory cell array 220 shown in FIG. 7.

Referring to FIG. 11, a circuit configuration of the high voltage generator for generating the high voltage VPP is exemplarily shown. The high voltage generator includes a current mirror type differential amplifier 10 including PMOS transistors PM1 and PM2 and NMOS transistors NM1 to NM3, an oscillator 20, a charge pump 30, and first and second variable resistors R1 and R2. In the field, the circuit configuration of a general high-voltage generator may substantially have the same configuration as that of FIG. 11 except for the first and second variable resistors R1 and R2.

The adjustment control signal changes the resistance values of the first and second variable resistors R1 and R2 in the high voltage generator, such that the high voltage output characteristics may be adjusted.

Similarly as described with respect to FIG. 10, the level-up or upper limit of the high voltage Vpp may be adjusted by increasing the resistance value of the first variable resistor R1 or decreasing the resistance value of the second variable resistor R2. The level-down or lower limit of the high voltage Vpp may be adjusted by decreasing the resistance value of the first variable resistor R1 or increasing the resistance value of the second variable resistor R2. The operation principle of FIG. 9 may be implemented to change the resistance values of the first and second resistors R1 and R2 according to the adjustment control signal. Thus, even in case of FIG. 11, the high-voltage output characteristics may be adjusted according to the adjustment control signal.

As described above, embodiments related to the storing and utilizing of operation environment information have been disclosed in the drawings and the specification, and should not limit the meaning and the scope of the inventive concept. Therefore, it should be appreciated by those skilled in the art that various modifications and equivalent embodiments may be made. For example, although embodiments have been mainly described in the disclosure, a circuit configuration and/or scheme of sensing or storing operation environment information may be changed or modified in a variety forms without departing from the inventive concept. In addition, although a semiconductor device including MRAM is mainly described, the inventive concept may be applied to other resistive semiconductor memory devices such as PRAM.

Figure 12:
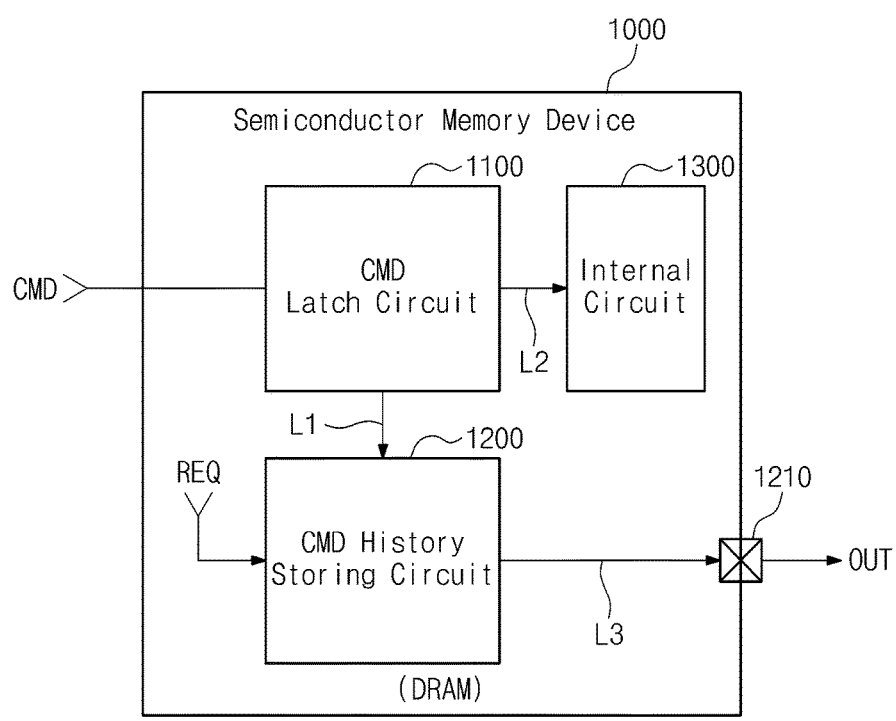
FIG. 12 illustrates a block diagram of a semiconductor memory device according to an embodiment of the inventive concept.

FIG. 12 illustrates a block diagram of a semiconductor memory device according to an embodiment of the inventive concept. Referring to FIG. 12, the semiconductor memory device 1000 includes a command (CMD) latch circuit 1100, an internal circuit 1300, and a command history storing circuit 1200.

The internal circuit 1300 may perform a function set in a semiconductor memory device (for example, DRAM) having volatile memory cells such as DRAM memory cells. For example, the internal circuit 1300 may include a memory cell array having a plurality of memory banks, a row decoder configured to select memory cells arranged in the memory cell array in a row direction, a column decoder configured to select the memory cells in a column direction, and a refresh control circuit configured to refresh the memory cells.

The command latch circuit 1100 is connected to the internal circuit 1300 through a line L2. The command latch circuit 1100 latches a command (CMD) received from an outside of the semiconductor memory device 1000 to control operations (such as for example a read, write, pre-charge, active, auto-refresh operation, or the like) of the internal circuit 1300. The command may be received through a dedicated command pin or a command address pin commonly receiving a command and an address.

The latched command may be stored in a latch circuit provided in the command latch circuit 1100. The latched command is applied to the internal circuit 1300 through the line L2 and in addition, is applied to the command history storing circuit 1200 through the line L1. For example, the latched command may be at least one of for example mode register set (MRS), auto-refresh (REF), self-refresh start (SELF), self-refresh exit, pre-charge, bank activation, write, read, bust stop, no-operation (NOP) device deselect, data input/output enable and data mask commands.

The command history storing circuit 1200 may store the latched command from the command latch circuit 1100 by a set capacity, and may output the stored command through a line L3 to an outside in response to an output request (REQ) signal received. That is, the command history storing circuit 1200 may store a set number of latched commands from the command latch circuit 1100. Although the embodiment is not limited to the above, the command history storing circuit 1200 may be a First In First Out (FIFO) memory in terms of function. In addition, the command history storing circuit 1200 may be implemented with a volatile memory including DRAM cells or SRAM cells. In other embodiments the command history storing circuit 1200 may be implemented with non-volatile memory including MRAM, PRAM or ReRAM. The command history storing circuit 1200 may directly function as an operation environment information storing circuit providing the operation environment information to an outside. In addition, the command history storing circuit 1200 may be configured to interact with an operation environment information storing circuit (not shown), to indirectly provide the operation environment information to an outside, such that the command may be transmitted to an outside together with the operation environment information.

In FIG. 12, a pad 1210 of the semiconductor memory device 1000 may be a data output pad or an additional output dedicated pad. When the pad 1210 is an output dedicated pad, the command output through the line L3 may be output through the pad 1210 as an output signal OUT. When the pad 1210 is a data output pad and the input/output data of the semiconductor memory device 1000 is not input and output, the command output through the line L3 may be output through the pad 1210 as an output signal OUT. As will be described below, when the pad 1210 is a data output pad, a switching circuit for selectively connecting one of the command outputs of the command history storing circuit 1200 to the input and output of the internal circuit 1300 may be further included in the semiconductor memory device 1000.

The command CMD applied to the command latch circuit 1100 may be provided from a processor in which a memory controller or an internal controller is embedded. For example, the command released from a memory controller or a processor (for example, a host processor) may occasionally have an error due to operation environment or other internal or external factors. In this case, when the memory controller or processor does not receive any responses to a command or performs a read operation, the memory controller or processor may not normally read out data. Thus, there is a need to allow the comments generated in the cycles previous to a current cycle to be fed back to the memory controller or processor. That is, an error of the feedback command received from the semiconductor memory device 1000 may be analyzed and a corrected or timing-adjusted command may be reproduced according to the analyzed result.

Therefore, when recognizing a command error, and thus needing to analyze the produced command or test the semiconductor memory device 1000, the memory controller or processor may allow the output request signal REQ to be generated. The output request signal REQ may be a signal directly applied from the memory controller or processor through a separated input pin provided to the semiconductor memory device 1000. In other embodiments the output request signal REQ may be a signal internally generated by the semiconductor memory device 1000 in response to a signal which is applied from the memory controller or processor to the semiconductor memory device 1000.

Since the semiconductor memory device 1000 of FIG. 12 stores the command by a capacity set in the command latch circuit 1100 and provides the stored command to the memory controller or processor in response to the output request signal REQ received, the semiconductor memory device 1000 may make it possible to analyze the command error conveniently.

Figure 13:
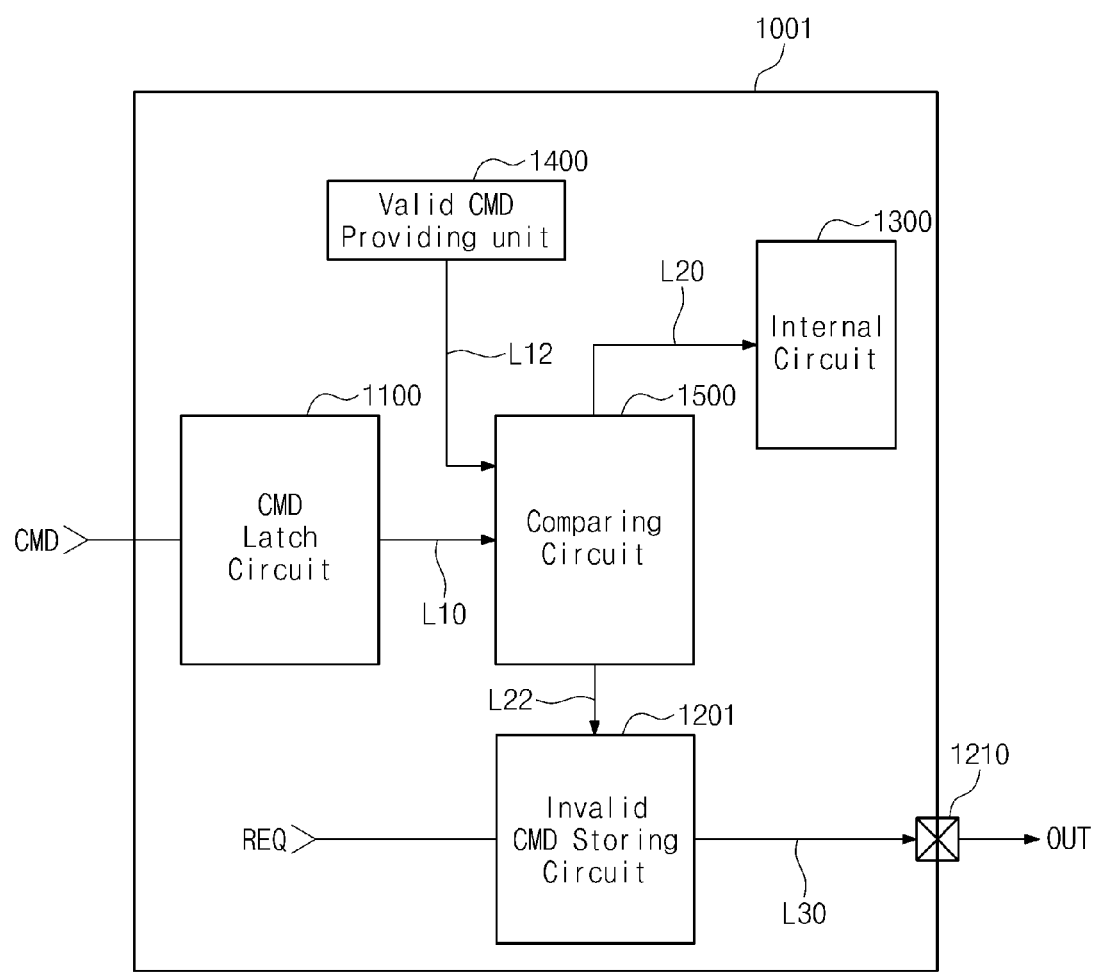
FIG. 13 illustrates a block diagram of a semiconductor memory device according to an embodiment of the inventive concept.

FIG. 13 illustrates a block diagram of a semiconductor memory device according to an embodiment of the inventive concept. Referring to FIG. 13, the semiconductor memory device 1001 includes a command (CMD) latch circuit 1100, an internal circuit 1300, a valid command providing unit 1400, a comparing circuit 1500, and an invalid command storing circuit 1201.

The CMD latch circuit 1100 and the internal circuit 1300 are identical or similar to those of FIG. 12. In the following description, the details of these will be omitted.

The valid command providing unit 1400 provides a valid format command, but is not limited thereto. For example, in a case of read command READ, a clock enable signal CKE is logic high during a preceding clock cycle (n−1), and a chip select signal /CS, a row address strobe signal /RAS, a column address strobe signal /CAS, and a write enable signal /WE are logic low, high, low and high, respectively. Thus, the command data for a read of a valid format command may be represented as "0101".

The comparing circuit 1500 receives the command provided from the memory controller or processor from the CMD latch circuit 1100 through a line L10. The comparing circuit 1500 receives the valid format command provided from the valid CMD providing unit 1400 through a line L12. The comparing circuit 1500 compares the received command and the valid format command with each other to detect whether an error occurs in the received command. For example, although not limited, when the read related command data of the valid format command are "0101" and the read command data latched to the command latch circuit 1100 are "0100", it may be determined that a command reception error occurs. When the command reception error occurs, the comparing circuit 1500 may output an error generation signal through a line L22. Thus, the invalid command storing circuit 1201 may store an invalid command by a set storage capacity. Differently from the command history storing circuit 1200 described with respect to FIG. 12, the invalid history storing circuit 1200 of FIG. 13 may store the invalid command instead of the valid command. That is, the invalid command storing circuit 1201 may store N invalid commands previous to the currently received command (where N is a natural number). In case that the invalid command storing circuit 1201 is implemented with an FIFO memory and 3 invalid commands are stored, when the fourth invalid command is stored, the first invalid command is discarded.

When command reception errors do not occur, that is, a normal command is received, the comparing circuit 1500 may output the normal reception signal to the internal circuit 1300 through a line L20. Thus, the command output from the command latch circuit 1100 may be applied to the internal circuit 1300.

The semiconductor memory device 1001 including the comparing circuit 1500 provided between the command latch circuit 1100 and the invalid command storing circuit 1201 may store invalid commands.

The semiconductor memory device 1001 may output the stored invalid command(s) to the memory controller or processor through the line L30 in response to the output request signal REQ received, so that the semiconductor memory device 1001 provides convenience for the analysis of a command error. Identically or similarly with FIG. 12, the pad 1210 of the semiconductor memory device 1001 shown in FIG. 13 may be a data output pad or a separated command output dedicated pad.

Figure 14:
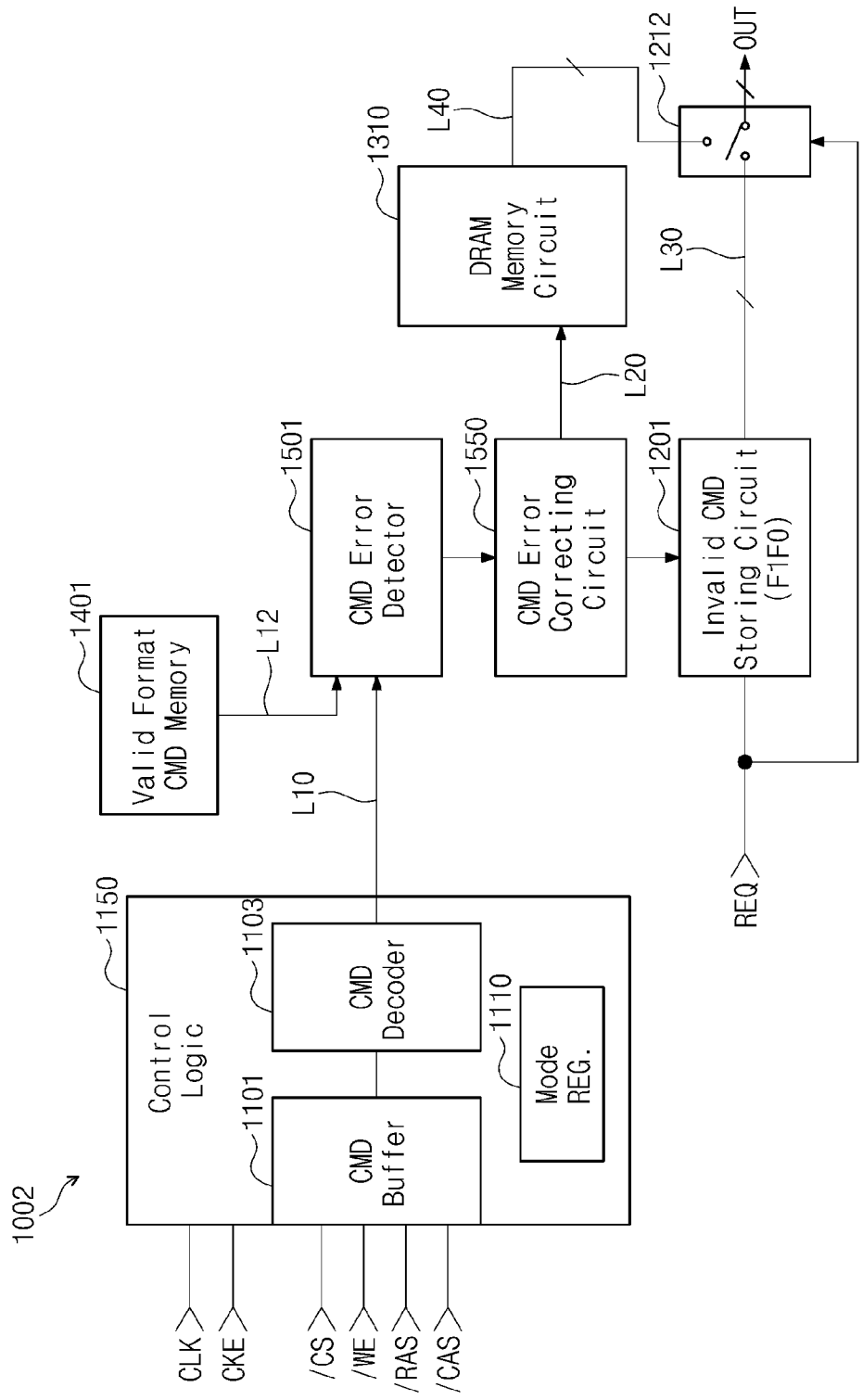
FIG. 14 illustrates a block diagram of a semiconductor memory device according to an embodiment of the inventive concept.

FIG. 14 illustrates a block diagram of a semiconductor memory device according to an embodiment of the inventive concept. Referring to FIG. 14, the semiconductor memory device 1002 includes a control logic 1150 including a command (CMD) decoder 1103, a command error detector 1501, a command error correcting circuit 1550, a DRAM memory circuit 1310, an invalid command storing circuit 1201, and an output switching part 1212. The control logic 1150 further includes a command buffer 1101 and a mode register 1110.

The DRAM memory circuit 1310 may include a DRAM memory cell array. The DRAM memory cell array may include a plurality of DRAM cells. The DRAM cell may include one access transistor and one storage capacitor.

The control logic 1150 buffers and decodes a command (CMD) received from an outside to control the memory operation of the DRAM memory circuit 1310. The command includes /CS, /RAS, /CAS, and /WE signals. Command buffer 1101 is configured to buffer a command and command decoder 1103 is configured to decode a command. Mode register 1110 is configured to set CAS latency and a burst length. The control logic 1150 may receive a clock (CLK) signal and a clock enable (CKE) signal from the memory controller or processor.

The command error detector 1501 is connected to the control logic 1150 through a line L10 and connected to the valid format command memory 1401 through a line L12. The valid format command memory 1401 has a function identical or similarly with that of the valid command providing unit 1400 of FIG. 13, which has been described above and thus further description thereof will be omitted. The command error detector 1501 compares a command received from the command decoder 1103 and the valid format command provided from the valid command memory 1401 with each other to detect whether an error occurs in the received command.

When an error occurs in the received command and it is possible to correct the error, the command error correcting circuit 1550 corrects the error. The number of error correctable bits may be dependent on the number of parity bits, but the embodiment is not limited thereto. For example, 1 to 5 parity bits may be included.

The invalid command storing circuit 1201 may store the command by a set capacity when the error is uncorrectable and may output the stored command to an outside in response to an output request signal REQ. The invalid command storing circuit 1201 may be implemented by using extra sense amplifiers among the sensing amplifiers in the semiconductor memory device 1002.

The output request signal REQ may be generated based on a signal provided from a system-on-chip (SoC) electrically connected to the semiconductor memory device 1002.

The switching circuit 1212 may select one of the input/output of the DRAM memory circuit 1310 and the command output of the invalid command storing circuit 1201 in response to the output request signal REQ to provide it as an output signal OUT. When the semiconductor memory device 1002 performs a read operation or a write operation, the switching circuit 1212 is connected to the line L40. When the output request signal REQ is received, the switching circuit 1212 may be connected to the line L30.

When the stored invalid command is output through pads different from data output pads of the semiconductor memory device 1002, the switching circuit 1212 may be removed.

Figure 15:
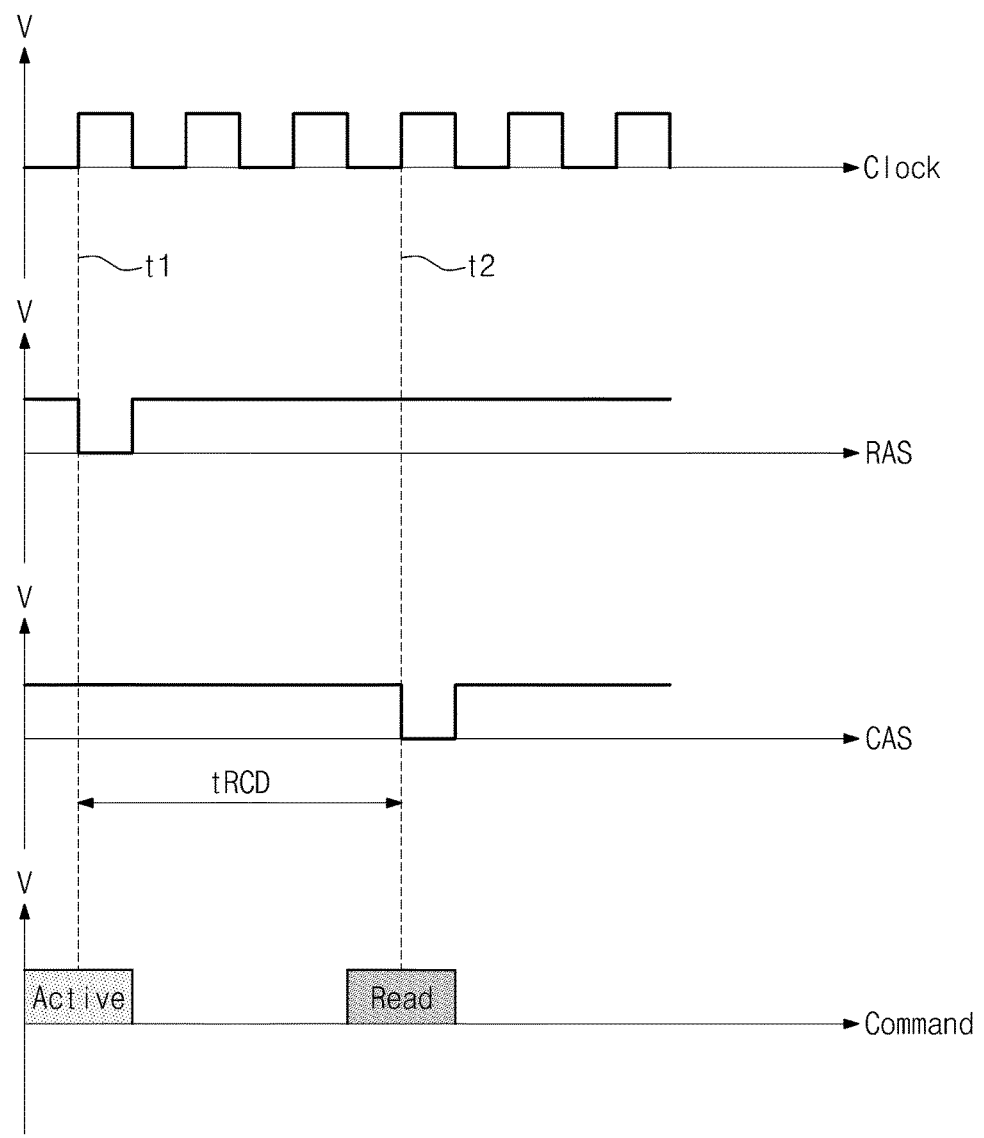
FIG. 15 illustrates a timing diagram of a read command error applied to embodiments of the inventive concept.
Figure 16:
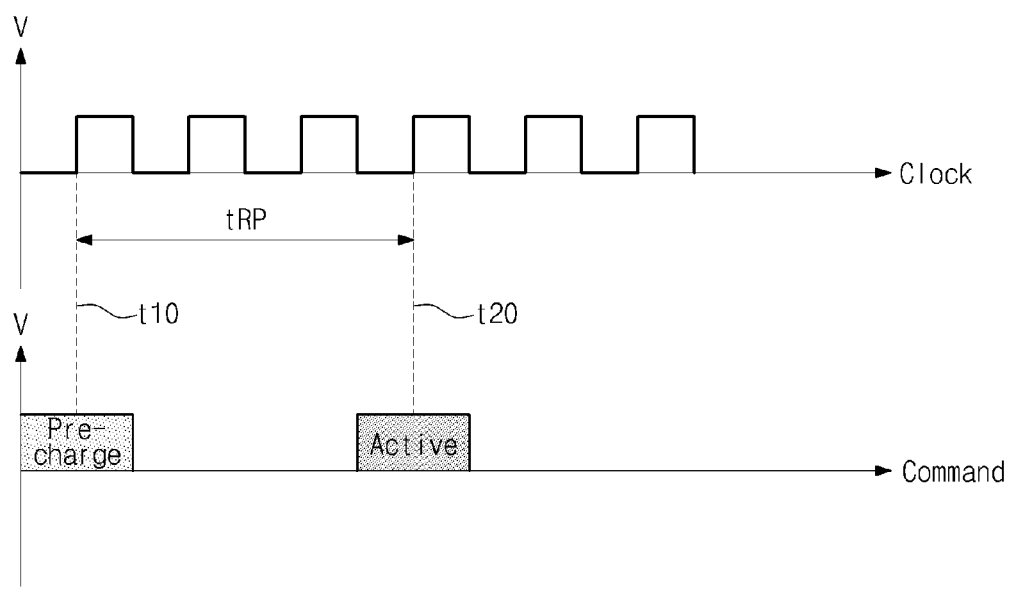
FIG. 16 illustrates a timing diagram of an active command error applied to embodiments of the inventive concept.

FIG. 15 illustrates a timing diagram of a read command error applied to embodiments of the inventive concept. FIG. 16 illustrates a timing diagram of an active command error applied to embodiments of the inventive concept.

First, referring to FIG. 15, a tRCD (Row Address to Column Address Delay) parameter is shown. As shown in FIG. 15, when command errors do not occur, that is, in a normal operation mode, RAS is transited to logic low at time point t1 and CAS is transited to logic low at time point at time point t2, so that a read command is generated. As compared with when the three-clock cycle is given as tRCD, when a two-clock cycle is given as tRCD, the semiconductor conductor memory may have better performance. When the active command is applied, a word line selected from the word lines of the memory cell array is activated at a set boosting level. Thus, the data of memory cells connected to the selected word line are sensed and amplified by corresponding sense amplifiers through corresponding bit lines and then, are stored. That is, the data of the memory cells selected when receiving an active command are stored through corresponding sense amplifiers, respectively. Next, when a read command is received, the column gate corresponding to a decoded column address is driven such that the data stored in the sense amplifiers are output through corresponding column gates.

When the read command READ is normal, signal CKE is logic high during a preceding clock cycle (n−1), and signals /CS, /RAS, /CAS, and /WE are logic low, high, low and high, respectively. Thus, the command data for read having the valid format command may be represented as "0101". However, if a command reception error occurs, "0100" may be applied as the command data for read. In this case, tRCD may be out of a specified timing margin, so that a read error occurs. Therefore, in FIG. 14, "0100" may be provided as an output signal OUT such that 0100" is fed back to the memory controller or host.

Referring to FIG. 16, a tRP (Row Precharge Time) parameter is shown. As shown in FIG. 16, when errors do not occur in a command, that is, in a normal operation mode, a pre-charge command is generated at time point t10 and an active command is generated at time point t20. Thus, in this case, a three-clock cycle is given as tRP. As compared with when the three-clock cycle is given as tRP, when a two-clock cycle is given as tRP, the semiconductor conductor memory may have better pre-charge performance. When the pre-charge command is applied, a bit line selected from the word lines of the memory cell array is pre-charged at a pre-charge level. For example, although not limited, the pre-charge level may be given as a half level (½VDD) of the power voltage VDD.

In FIG. 16, when the active command is applied, a word line selected from the word lines of the memory cell array according to a low address is activated at a set boosting level. Thus, the data of memory cells connected to the selected word line are sensed and amplified by corresponding sense amplifiers through corresponding bit lines and then, are stored.

When the active command is normal, signal CKE is logic high during a preceding clock cycle (n−1), and signals /CS, /RAS, /CAS, and /WE are logic low, low, high and high, respectively. Thus, the command data for read of the valid format command may be represented as "0011". However, when an active command reception error occurs, for example, "0010" may be input as active related command data. In this case, a reception error may occur to cause an active operation error. Therefore, in FIG. 14, "0010" may be provided as an output signal OUT such that 0010" is fed back to the memory controller or host.

While the inventive concept has been described with reference to embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A memory system comprising:
a semiconductor memory device comprising
an internal circuit configured to perform a function set in the semiconductor memory device, and
an operation environment information storing circuit configured to sense information about an operation environment of the semiconductor memory device when the semiconductor memory device operates, and store operation environment information in non-volatile memory cells based on the sensed information; and
a memory controller configured to read the operation environment information stored in the non-volatile memory cells, and predict an exchange time for replacing the semiconductor memory device based on the operation environment information read from the non-volatile memory cells.

2. The memory system of claim 1, wherein the non-volatile memory cells comprise MRAM cells.

3. The memory system of claim 1, wherein the operation environment information comprises use time data representing a use time of the semiconductor memory device.

4. The memory system of claim 1, wherein the operation environment information comprises operating voltage data representing an operating voltage of the semiconductor memory device.

5. The memory system of claim 1, wherein the operation environment information comprises operating temperature data representing an operating temperature of the semiconductor memory device.

6. The memory system of claim 1, further comprising a delay circuit configured to provide delay signals to adjust delay times of the internal circuit and to change a delay degree of the delay signals responsive to the operation environment information.

7. The memory system of claim 1, wherein the operation environment information comprises use time data obtained by cumulatively totaling a duration time of a power-on state of the semiconductor memory device.

8. The memory system of claim 1, wherein the operation environment information storing circuit is further configured to generate an adjustment control signal responsive to the operation environment information, and the internal circuit is configured to change operation parameters of the internal circuit responsive to the adjustment control signal.

9. The memory system of claim 1, wherein the memory controller is further configured to provide an alarm signal informing that the semiconductor memory device should be replaced based on the predicted exchange time.

10. The memory system of claim 1, wherein the operation environment information storing circuit is configured to store the operation environment information in units of predetermined periods.

11. The memory system of claim 1, further comprising a buffer circuit configured to buffer data in the internal circuit and to adjust buffering responsive to the operation environment information.

12. A semiconductor memory device comprising:
an internal circuit configured to perform a function set in the semiconductor memory device;
an operation environment information storing circuit configured to sense information about an operation environment of the semiconductor memory device when the semiconductor memory device operates, store operation environment information in non-volatile memory cells based on the sensed information, and provide the operation environment information stored in the non-volatile memory cells externally of the semiconductor memory device in response to a request for reading out information; and
a buffer circuit configured to buffer data in the internal circuit and to adjust buffering responsive to the operation environment information stored in the non-volatile memory cells.

* * * * *